United States Patent [19]

Giangano et al.

[11] Patent Number: 5,010,339
[45] Date of Patent: Apr. 23, 1991

[54] ULTRA LINEAR SPECTROSCOPIC ANALOG-TO-DIGITAL CONVERTER

[75] Inventors: David A. Giangano, Elmhurst; Martin Kesselman, Commack; Steven Bocskor, Ronkonkoma; Anthony R. Celona, Northport, all of N.Y.

[73] Assignee: Grumman Aerospace Corporation, Bethpage, N.Y.

[21] Appl. No.: 502,746

[22] Filed: Apr. 2, 1990

[51] Int. Cl.$^5$ .............................................. H03M 1/34
[52] U.S. Cl. .................................. 341/164; 341/165; 341/127
[58] Field of Search ............... 341/165, 164, 163, 155, 341/127, 118

[56] References Cited

U.S. PATENT DOCUMENTS 4,839,650 6/1989 Geen et al. ...................... 341/155 X
4,897,650 1/1990 Shott, III et al. ............... 341/164 X

OTHER PUBLICATIONS

Giangano, D. A., "Ultra-Linear, 14-Bit Spectroscopy ADC," Grumman Corporate Research Center, Bethpage, New York.
Cottini, et al., "Letters to the Editor—A New Method for Analog to Digital Conversion," Nuclear Instruments and Methods, 24 (1963) 241-242; North—Holland Publishing Co.
Correia, et al., "An Analog-to-Digital Converter Module for Nuclear Spectrometry," Nuclear Instruments and Methods in Physics Research, A235 (1985) 536-241 North—Holland, Amsterdam.
Xianjie, et al., "A New Sliding Scale Principle and the Spectroscopic ADC Based on this Principle," Nuclear Instruments and Methods in Physics Research, A259 (1987) 521-524, North Holland, Amsterdam.
Morita, M., et al. "An Ultra High Throughput ADC," IEEE Transactions on Nuclear Science, vol. 36, No. 1, Feb. 1989.
Ditigal Device Corp., 12-bit, $\pm\frac{1}{2}$ LSB DNL, 500 nSec, Subranging ADC.

Primary Examiner—A. D. Pellinen
Assistant Examiner—Sharon D. Logan
Attorney, Agent, or Firm—Pollock, VandeSande & Priddy

[57] ABSTRACT

A sliding scale averaging technique is employed for an analog-to-digital converter. An analog signal is summed with a varying number prior to conversion. This causes repeated input voltage signals of the same value to be converted in different bins of the ADC converter thereby minimizing errors due to unequal bin widths. The present invention includes a comparator technique for ensuring that the summed signal does not exceed the full dynamic range of the ADC.

9 Claims, 2 Drawing Sheets

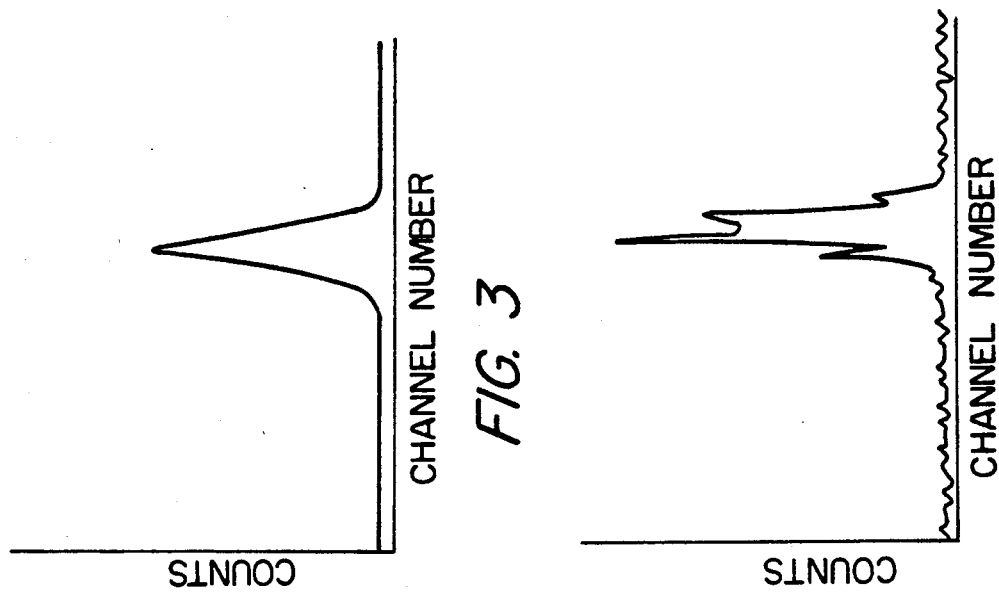
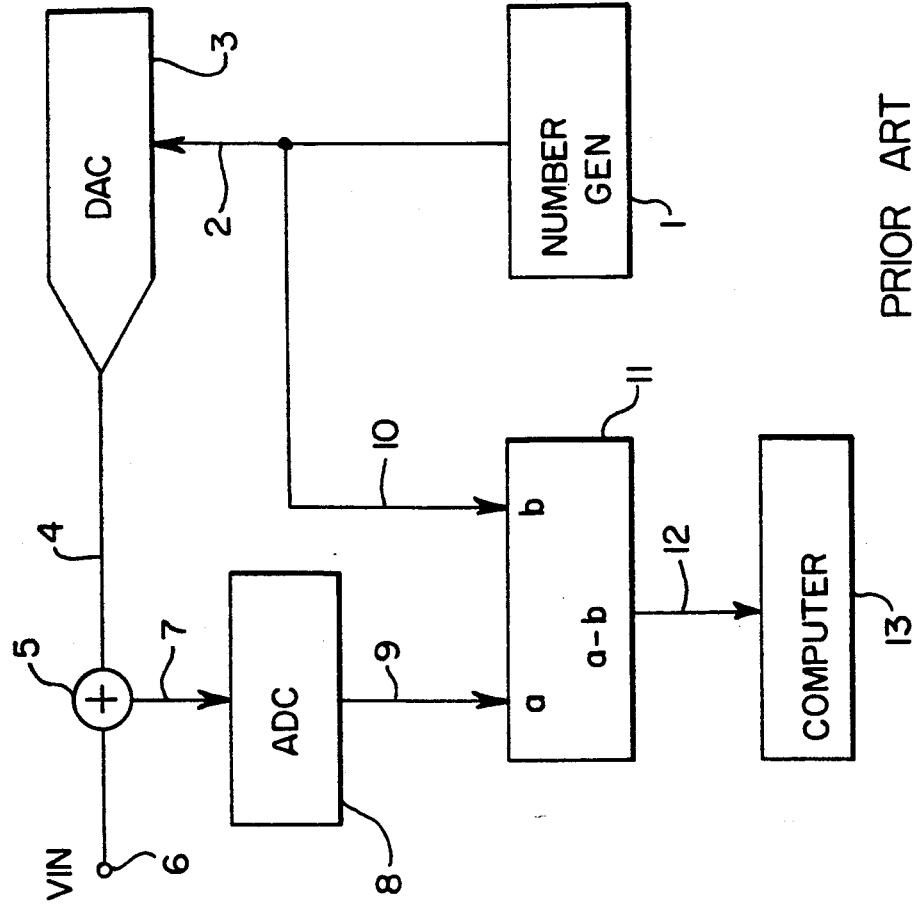

ULTRA LINEAR SPECTROSCOPIC ANALOG-TO-DIGITAL CONVERTER

FIELD OF THE INVENTION

The present invention relates to pulse height spectroscopic analyzers, and more particularly to an analog-to-digital converting system for such analyzers.

BACKGROUND OF THE INVENTION

The analog-to-digital converters (ADCs) used in pulse-height spectroscopic analyzers displaying amplitude probability distributions of electric signals require low differential non-linearity (DNL) and low conversion time. Commercially available ADCs cannot be directly used for spectroscopic applications, since DNL associated with them can be as high as ±1 least significant bit (LSB). This is unacceptable for spectroscopic applications, which require a DNL of ±1/100 LSB. Many techniques have been developed to achieve this requirement. These techniques rise sharply in complexity as a direct result of higher resolution and utilization of full ADC dynamic range.

BRIEF DESCRIPTION OF THE PRIOR ART

The standard sliding scale method is discussed in the reference: Cottini, C., et al., *Nucl. Instru. and Meth.* 24 (1963) 241. The system of this reference utilizes a bin width averaging effect obtained by summing an auxiliary incrementing analog signal to the ADC input, whose digital representation is subtracted from the ADC output after conversion in order to obtain the true digital representation of this input. This block diagram for carrying out this method is shown in FIG. 1, which is discussed herein. For each input value the ADC conversion point is thus incrementally distributed assigning different channels to the input. The result of this operation is the statistical equalization of the channel widths.

A major drawback of this method is the reduction in ADC dynamic range by an amount equal to the auxiliary level range. This is discussed in the reference: Correia, C. B. A., *Nucl. Instr. and Meth.*, A235 (1985) 536. This effect takes place at the top of the input scale, if the incrementing signal is positive, and can occur whenever the input voltage falls within the last M channels of the ADC range, M being the number of channels swept by the averaging digital-to-analog converter (DAC). A dilemma arises from this limitation, because the sweeping range of the averaging DAC must be small in order to keep a large input range, but large enough to have an efficient averaging effect.

A more recent approach to this problem incorporates upward and downward averaging, for no waste of dynamic range. Such an approach is explored in the reference: Xianjie, X., *Nucl. Instr. and Meth.*, A259 (1987) 521. A threshold circuit is used in the ADC establishing a comparator trip point somewhere around the middle of the ADC. If the amplitude of the input signal exceeds the threshold, a downward averaging process is performed. If not, the upward averaging process will be used.

Problems with this approach arise, because the threshold must not lie in the upper or lower $2^{(m-1)}$ channels. Channel width of the channel in which the threshold lies is not averaged. In order to equalize the channel width of this channel, the threshold must be modulated by a triangular voltage, so that the width of this special channel is also smoothed. The worst DNL of a successive approximation ADC usually occurs $\frac{1}{4}$, $\frac{1}{2}$, and $\frac{3}{4}$ of full scale. Therefore, the modulated region of the threshold cannot be placed in the above areas, and at the same time it should not overlap the upper and lower $2^{(m-1)}$ channels. This limits the amount of averaging bits of M to (N−2) N being the resolution of the ADC.

Complicating the matter further, new high speed subranging ADCs exhibit poor DNL at their internal transition between ranges. The internal architecture of this type of ADC performs a flash conversion on the seven MSBs first, then processes the five LSBs ($2^5=32$) next. This creates an internal split point that exhibits poor DNL associated with that bit. Since all ADC manufacturers use varying techniques, DNL regions fluctuate from device to device.

BRIEF DESCRIPTION OF THE INVENTION

The simplicity of the ADC system presented herein, in comparison to conventional ones, achieves a successful solution of the aforesaid problem by presenting a realizable technique for achieving higher stability and accuracy with lower DNL and circuit complexity.

A new sliding scale averaging technique has been used for an N-bit ADC. The number of bits M for a sliding scale may be increased from (N−2) defined in the previous method to N. This obtains 100 percent averaging while still maintaining full ADC dynamic range. The modulation circuit required in the previous method is no longer needed. This change in design methodology lowers part count, circuit complexity, and improves circuit stability.

BRIEF DESCRIPTION OF THE FIGURES

The above-mentioned objects and advantages of the present invention will be more clearly understood when considered in conjunction with the accompanying drawings, in which:

FIG. 1 is a block diagram of the prior art;
FIG. 3 is a plot of a histogram obtained with channel averaging;
FIG. 4 is a plot of a histogram obtained without channel averaging.

DETAILED DESCRIPTION OF THE INVENTION

Figure 2:
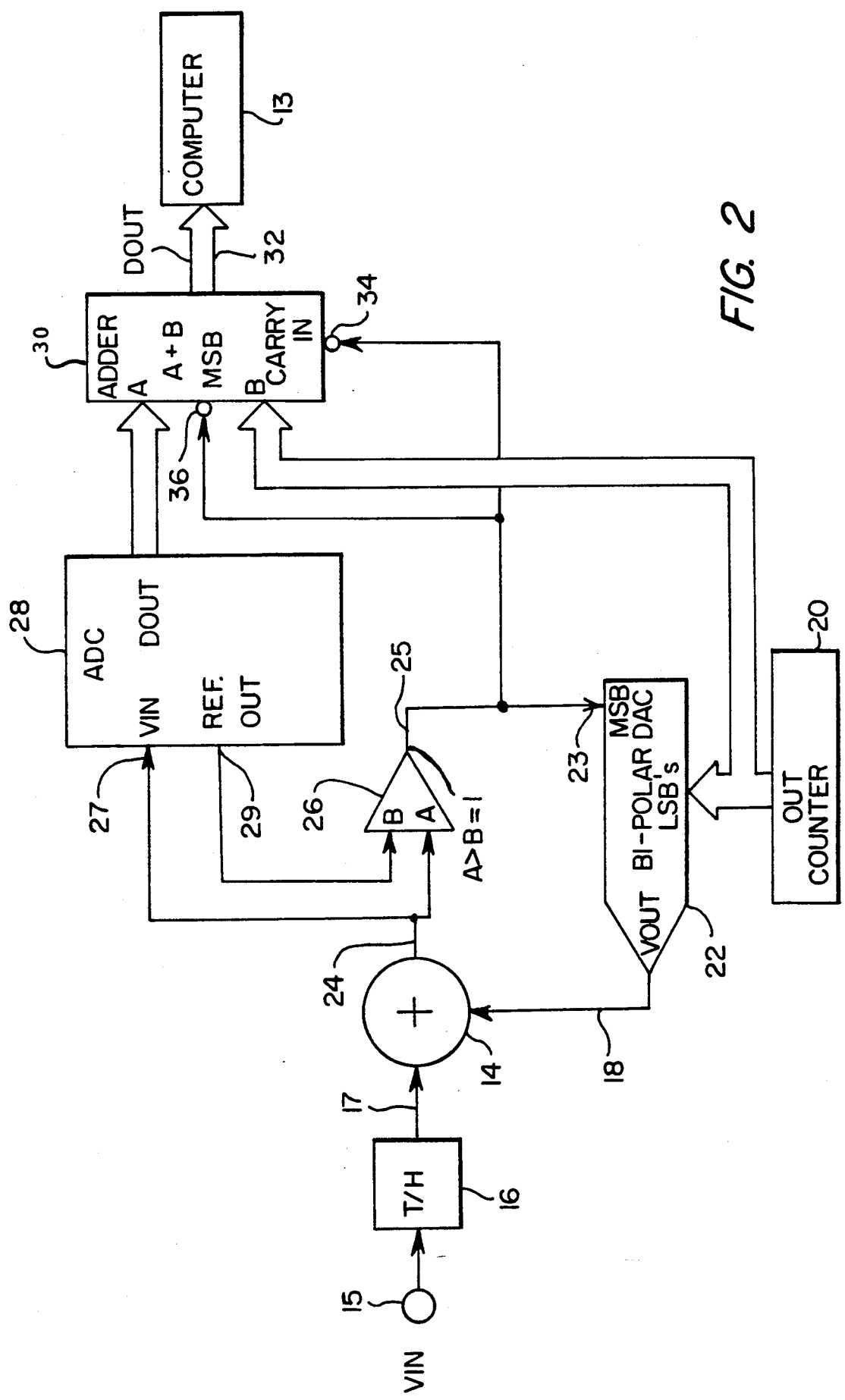
FIG. 2 is a block diagram of the present invention.

Prior to exploring the operation of the present invention, the prior art of FIG. 1 will be discussed since the present invention is an improvement thereover. Conventional ADC circuits, such as indicated by reference numeral 8, perform conversions in a number of contiguous channels, a particular channel depending upon the value of the analog input voltage. Conceptually, the channels are to have equal width so that input voltage signals across the entire dynamic range of the converter should be evenly distributed within the various channels. However, in reality, this is not the case; and in fact, certain bins will be larger than others. In order to avoid this problem, the prior art illustrated in FIG. 1 basically variably shifts the level of the input voltage to the converter so that the same input voltage during different input intervals will be converted in different channels of the converter. Accordingly, any errors will be averaged thereby minimizing their effect.

In order to understand how this is accomplished, continuing reference is made to FIG. 1 wherein number generator 1 is included in the circuit to achieve the level shifting just discussed. The generator 1 may be a random number or sequential number generator of conventional design. Its output forms the input 2 of DAC 3. After conversion to an analog form, the generated number is summed, via line 4, with the input voltage 4 (at input contact 6) in a unity operational amplifier summer 5. The resultant output at line 7 is input to the ADC 8. Thus, during two successive intervals wherein the same input voltage is present, the generated number will be different so that the resultant summed number at line 7 will be converted by different bins of the ADC 8. Now, it is important to restore the original input voltage. This is accomplished at a digital subtractor 11. This subtractor has the first level shifted input "a" while the number generator is connected to a second input "b" along connecting lead 10. The subtractor then subtracts the value of the generated number so that the original voltage is retrieved The end result is that the conversion for the same value of input voltage will occur in different bins of the ADC 8 so that any conversion errors due to uneven channel widths is averaged out.

In order to obtain a spectroscopic distribution of the input voltages, a computer 13 is connected to the output of the subtractor 11. The computer performs an amplitude probability distribution in accordance with well-known techniques so that a histogram of counts for particular input voltages may be obtained as a function of ADC channel number.

FIG. 4 illustrates a typical amplitude probability distribution from a straightforward ADC 8 without utilizing the averaging technique just discussed. The sharper and more clearly defined distribution of FIG. 4 is typical for the same input signal and data collection time for an ADC 8 which is connected as shown in FIG. 1 and wherein the discussed averaging technique is employed. However, as previously discussed, the dynamic range of ADC 8 is reduced by an amount equal to the auxiliary level shifting of the converted generated number supplied to summer 5.

The improvement constituting the present invention is illustrated in FIG. 2. The system set forth in FIG. 2 also accomplishes a bin averaging technique but avoids the problems discussed in connection with the implementation shown in FIG. 1. In greater detail, this is accomplished when an input voltage appearing at terminal 15 is sampled by a track-and-hold circuit 16. The output of the latter circuit is input at 17 to the unity gain operational amplifier summer 14. A second input to the summer 14 occurs at terminal 18 which carries the analog form of the converted digital count at the sampling moment. The counter 20 is basically a sequential generator that is input to DAC 22 at the latter circuit's least significant bit inputs (LSB). Prior to any conversion, the output 24 of summer 14 is compared with the full range of the ADC 28 to determine whether the summed signal falls outside its full range. To accomplish this, the ADC 28 has a full range output signal at 29 which serves as input "B" of threshold comparator 26. The output of summer 14 is directly connected to input "A" of the comparator 26. If the full scale reference output of ADC 28 ("B") is greater than the signal summed at summer 14 ("A"), the output of the threshold comparator generates a binary zero so that the most significant bit (MSB) of the bi-polar DAC 22 is not set and the circuit will operate in a manner similar to that explained in connection with the prior art circuit of FIG. 1. However, in the event that the addition at summer 14 ("A") exceeds the full range reference output ("B"), the comparison by comparator 26 will generate a binary 1 which is transferred to the most significant bit (MSB) input 23 of DAC 22. This causes the summer 14 to subtract the inputs 17 and 18 thereby ensuring that the analog output from summer 14 will not exceed the full range of the ADC 28.

The output of summer 14 is connected to the input 27 of ADC 28. The output of the ADC 28 is supplied to the input "A" of a digital adder 30. A parallel output of the counter 20 is connected to the input "B" of digital adder 30.

The digital adder 30 performs a 2's complement addition which, in effect, subtracts the counter number from the output of the ADC 28 so that the output 32 of adder 30 is a converted digital transformation of the analog input at 15. However, in the event that the summer 14 sums two quantities which exceed the full range of ADC 28, and as a consequence the MSB of DAC 22 is set, the terminal 25 of the threshold comparator 26 is also connected to the "carry in" input of the digital adder 30 thereby resulting in normal addition. As a consequence, a proper digital output from the adder 30 is again obtained representing the digital analog of the input voltage at 15. In a preferred embodiment of the present invention, the ADC 28 is a 14-bit converter as is the bi-polar DAC 22. In order to ensure proper conversion of the analog input, the "B" input of adder 30 includes the 13 bits of the counter output 20 while a most significant bit is formed at terminal 36, in parallel with the output terminal 25 of comparator 26 and control carry input 34.

Since regular subtraction (at summer 14) or downward averaging takes place as a result of the summed input voltage and DAC voltage exceeding the dynamic range of the ADC 28, the input threshold trigger point for the ADC constantly changes. This eliminates the need for a modulation circuit as required by the prior art to average the threshold point.

Thus, as a result of the present invention, a new sliding scale averaging technique has been developed which utilizes a greater number of bits for a sliding scale. The end result is 100 percent averaging which produces an improvement in differential non-linearity (DNL) by a factor of 4, while still maintaining full ADC dynamic range. The modulation circuit of the prior art being no longer required results in fewer circuit parts and complexity as well as a reduced potential drift problem. Calibration time is also reduced and circuit stability is enhanced.

A computer 13 is connected to the output of adder 30 so that a histogram showing a clear amplitude probability distribution can be generated, as shown in FIG. 3. The distribution of FIG. 3 is merely illustrative of the ability of the present invention to serve in a spectroscopic system. FIG. 3 illustrates the advantage of an averaging technique as opposed to the acquisition of a histogram without an averaging technique, the latter being demonstrated in FIG. 4.

It should be understood that the invention is not limited to the exact details of construction shown and described herein for obvious modifications will occur to persons skilled in the art.

We claim:

1. In an analog-to-digital converter (ADC) network having means for generating a variable analog count for summing with an analog input signal, the result of which is converted to a digital number by an ADC, the variable count being subtracted thereafter for a final digital output, the improvement comprising:

bi-polar digital-to-analog converter (DAC) means connected between a digital number generator which generates the variable count and a first input of a summing means;

means for sampling the input signal;

means for connecting the sampled input signal to a second input of the summing means;

a comparator;

means connecting a full scale reference voltage of the ADC to a first input of the comparator;

means connecting the output of the summing means to a second input of the comparator to obtain a comparison;

the bi-polar DAC having a most significant bit (MSB) input connected to the output of the comparator for setting the MSB of the DAC when the comparison indicates the full scale of the ADC is exceeded;

wherein first and second inputs of the summing means are subtracted thereby producing a comparator input within range for the ADC; and means connected to the output of the ADC and the number generator for separating the variable count from the output of the DAC thereby reconstructing the digitally converted analog input signal.

2. The subject matter set forth in claim 1 wherein the sampling means is a track-and-hold circuit.

3. The subject matter set forth in claim 1 wherein the number generator generates sequential numbers.

4. An analog-to-digital converter (ADC) network comprising:

a summing circuit connected at a first input to a sampled input analog signal voltage;

a digital number generator;

a bi-polar digital-to-analog converter (DAC) connected between the digital number generator and a second input of the summing circuit;

an ADC having a full scale reference voltage output connected to a first input of a comparator, the comparator having a second input connected to an output of the summing circuit for determining whether a summed sampled signal and a converted count from the generator exceeds the full range of the ADC;

means connecting an output of the comparator to a most significant bit (MSB) input of the bi-polar DAC for reversing the polarity of the bi-polar DAC when the full range is exceeded;

means having first and second inputs connected to an output of the ADC and an output of the number generator for eliminating any contribution of a converted count from the output of the ADC thereby reconstructing a digital value of the sampled input analog voltage signal.

5. The structure set forth in claim 4 wherein a track-and-hold circuit samples the input analog signal voltage.

6. The structure set forth in claim 5 wherein the number generator generates sequential numbers.

7. The structure set forth in claim 4 together with computer means for storing the number of times particular ranges of the values of input analog signal voltage occur thereby permitting the generation of a histogram from the input analog signal voltage.

8. A method for generating a spectroscopic histogram comprising the steps:

subjecting detectors to nuclear particles for generating a characteristic voltage therefrom;

generating a variable count;

converting the count to an analog quantity;

summing the voltage with the analog quantity;

comparing the summed voltage and quantity to a full scale reference voltage of an analog-to-digital converter;

in the event the summed values are less than the reference voltage (a) performing an analog-to-digital conversion on the summed voltage and quantity;

(b) subtracting the converted analog count quantity from the converted summed quantity and voltage thereby producing a digital output representative of the characteristic voltage;

in the event the summed value is greater than the reference voltage (a) subtracting the converted analog count quantity from the voltage;

(b) performing an analog-to-digital conversion on the result of the immediately preceding step; and (c) adding the digital count to the digital result of the immediately preceding step thereby producing a digital output representative of the characteristic voltage;

dividing digital outputs representative of the characteristic voltage into corresponding continuous channels;

storing the number of occurrences in each channel over a preselected interval thereby creating data for a histogram.

9. The method set forth in claim 8 together with the preliminary step of tracking and holding each generated characteristic voltage.

* * * * *